(12) United States Patent
Kim et al.

(10) Patent No.: US 7,518,298 B2
(45) Date of Patent: Apr. 14, 2009

(54) PLASMA DISPLAY APPARATUS HAVING AT LEAST ONE THERMAL CONDUCTIVE SHEET

(75) Inventors: Ki-Jung Kim, Suwon-si (KR); Sung-Won Bae, Suwon-si (KR); Hyuk Kim, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 47 days.

(21) Appl. No.: 11/221,796

(22) Filed: Sep. 9, 2005

(65) Prior Publication Data

US 2006/0077635 A1 Apr. 13, 2006

(30) Foreign Application Priority Data

Oct. 12, 2004 (KR) .................. 10-2004-0081361

(51) Int. Cl.
*H01J 17/49* (2006.01)
*H01J 7/24* (2006.01)

(52) U.S. Cl. .................. 313/46; 313/582; 361/704

(58) Field of Classification Search ......... 313/582–587, 313/46; 361/704
See application file for complete search history.

(56) References Cited

U.S. PATENT DOCUMENTS 7,072,007 B2 * 7/2006 Kaneko .................. 349/58

2002/0043916 A1 4/2002 Juen
2003/0102789 A1 * 6/2003 Kim et al. .................. 313/44

FOREIGN PATENT DOCUMENTS

| JP | 2000-219852 | 5/2001 |
| JP | 2003-029647 | 1/2003 |
| JP | 2003-131580 | 5/2003 |
| JP | 2003-131581 | 5/2003 |
| JP | 2003-195773 | 7/2003 |
| JP | 2004-053786 | 2/2004 |
| JP | 2004-146106 | 5/2004 |

OTHER PUBLICATIONS

Korean Office Action of the Korean Patent Application No. 2004-81361, issued on Jun. 26, 2006.
*Office Action* from the Japanese Patent Office issued in Applicant's corresponding Japanese Patent Application No. 2005-172370 dated Oct. 30, 2007.
*Office Action* from the Chinese Patent Office issued in Applicant's corresponding Chinese Patent Application No. 2005-10113615.6 dated Apr. 18, 2008.

* cited by examiner

*Primary Examiner*—Joseph L Williams
(74) *Attorney, Agent, or Firm*—Robert E. Bushnell, Esq.

(57) ABSTRACT

A plasma display apparatus having shortened production time is composed of: a plasma display panel; a chassis base having a front part on which the plasma display panel is installed, and having a back part on which circuit boards including circuits for driving the plasma display panel are installed; and at least one thermal conductive sheet positioned between the plasma display panel and the chassis base, and having an interior on which a cut away portion is formed.

18 Claims, 4 Drawing Sheets

PLASMA DISPLAY APPARATUS HAVING AT LEAST ONE THERMAL CONDUCTIVE SHEET

CLAIM OF PRIORITY

This application makes reference to, incorporates the same herein, and claims all benefits accruing under 35 U.S.C. §119 from an application for PLASMA DISPLAY APPARATUS earlier filed in the Korean Intellectual Property Office on Oct. 12, 2004 and there duly assigned Serial 10-2004-0081361.

BACKGROUND OF THE INVENTION

1. Technical Field

The present invention relates to a plasma display apparatus and, more particularly, to a plasma display apparatus having a shortened manufacturing time.

2. Related Art

A plasma display apparatus is a flat display apparatus for displaying an image using a gas discharge phenomenon. The plasma display apparatus is excellent in terms of display Is capacity, brightness, contrast, image sticking, and view angle, etc., and is characterized by small thickness and a large-sized screen. Therefore, the plasma display apparatus has been in the spotlight as a replacement for the conventional cathode-ray tube display apparatus.

The general plasma display apparatus comprises a plasma display panel for displaying an image, a chassis base, and circuits for driving the plasma display panel. Furthermore, thermal conductive sheets are arranged between the plasma display panel and the chassis base and perform a function of transferring heat generated in the plasma display panel to the chassis base.

The thermal conductive sheets are arranged on the back surface of the plasma display panel, and double sided adhesive tapes are placed at portions between outer portions of the thermal conductive sheets. In this respect, double sided adhesive tapes perform the function of fixing the plasma display panel to the chassis base. However, such a structure using thermal conductive sheets requires a lot of working time in attaching the thermal conductive sheets to the plasma display panel, thus resulting in a disadvantage with respect to mass production.

SUMMARY OF THE INVENTION

The present invention provides a plasma display apparatus having a shortened production time.

According to an aspect of the present invention, a plasma display apparatus comprises: a plasma display panel; a chassis base having a front part on which the plasma display panel is installed and having a back part on which circuit boards including circuits for driving the plasma display panel are installed; and a thermal conductive sheet arranged between the plasma display panel and the chassis base, and having a cut away portion formed at the interior thereof.

A single thermal conductive sheet may be employed. Furthermore, the cut away portion may be in the shape of a slit that extends to a predetermined length.

According to the present invention, the manufacturing time for a plasma display apparatus is decreased by using a single thermal conductive sheet. Furthermore, noise or shock of the plasma display apparatus is decreased by providing a shock-absorbing element positioned in the cut away portion.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described more fully with reference to the accompanying drawings, in which exemplary embodiments of the present invention are shown.

Figure 1:
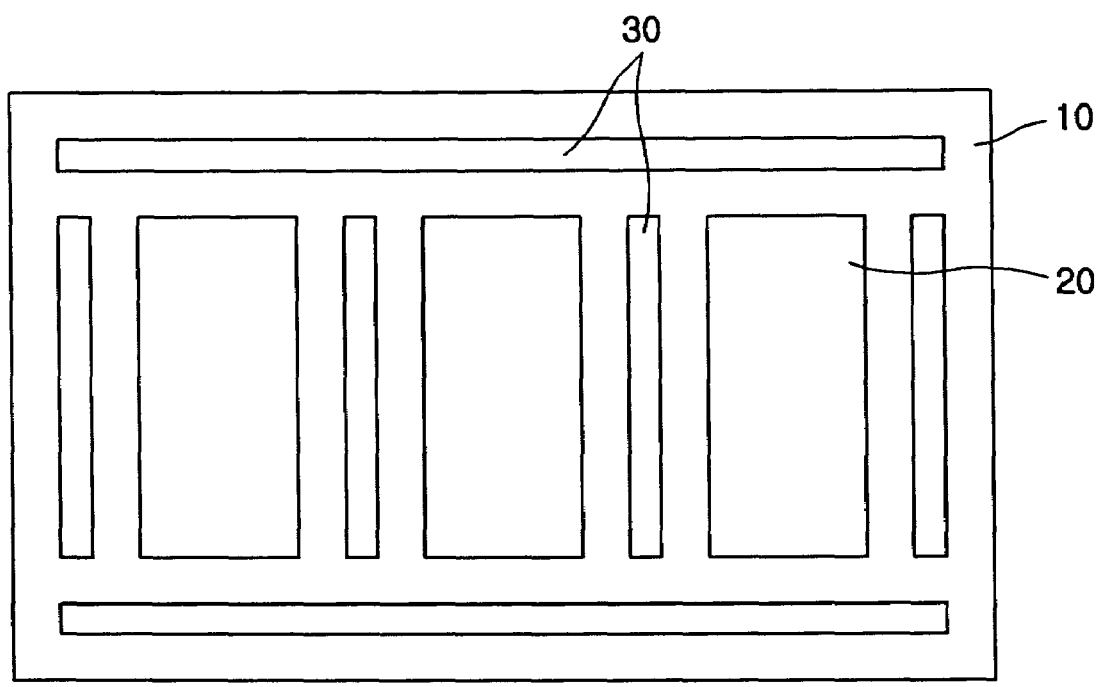
FIG. 1 is a top plan view of thermal conductive sheets and double sided adhesive tapes arranged on a back surface of a plasma display panel in a plasma display apparatus.

FIG. 1 is a top plan view of thermal conductive sheets and double sided adhesive tapes arranged on a back surface of a plasma display panel in a plasma display apparatus.

FIG. 1 shows thermal conductive sheets 20 and double sided adhesive tapes 30 arranged on a back surface of a plasma display panel 10. As shown in FIG. 1, thermal conductive sheets 20 are arranged on the back surface of the plasma display panel 10, and double sided adhesive tapes 30 are arranged at portions between outer portions of the thermal conductive sheets 20. In this regard, double sided adhesive tapes 30 perform the function of fixing the plasma display panel to the chassis base. However, such a structure using thermal conductive sheets requires a lot of working time in attaching the thermal conductive sheets 20 to the plasma display panel 10, thus resulting in a disadvantage with respect to mass production.

Figure 2:
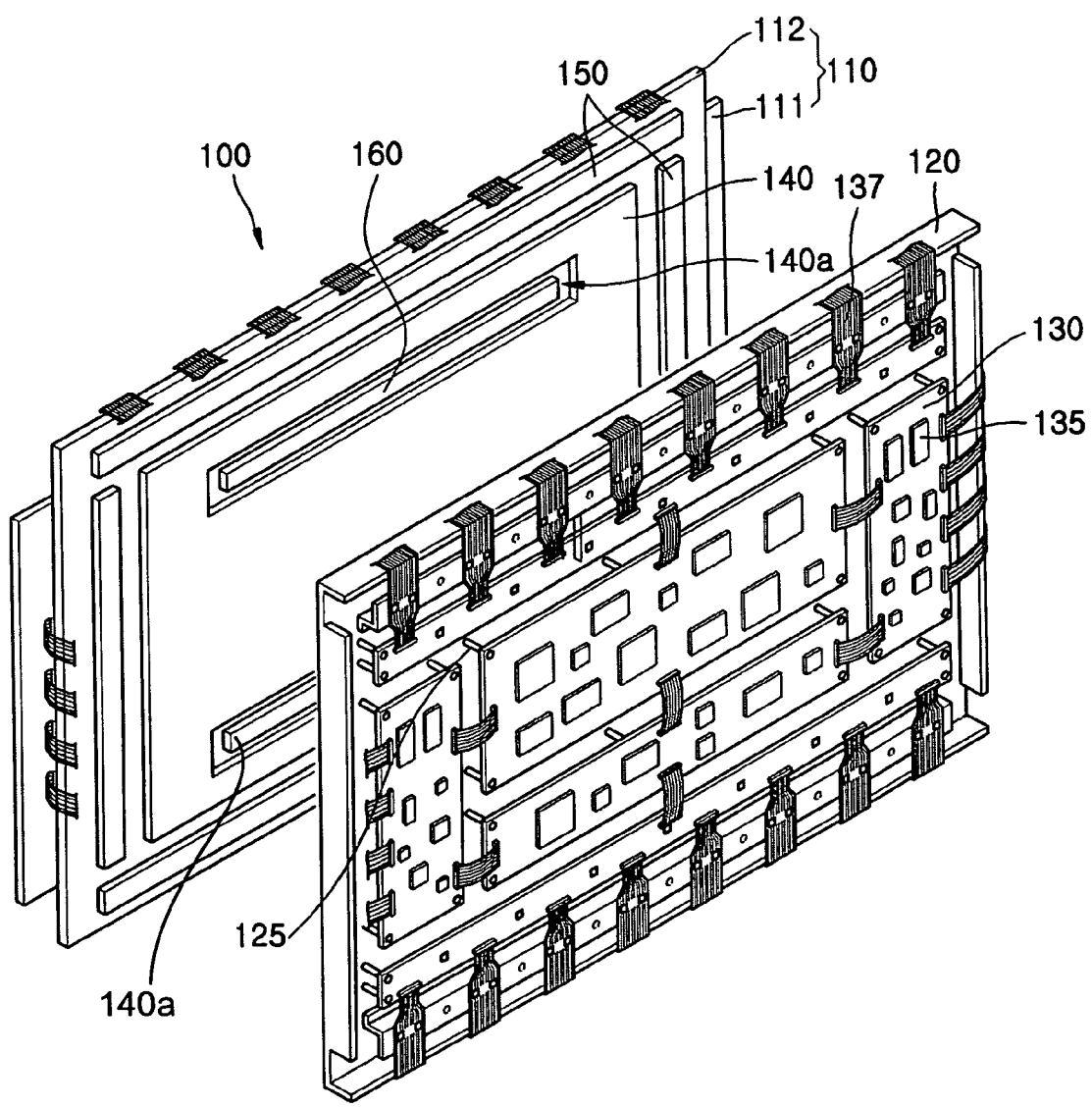
FIG. 2 is an exploded perspective view of a plasma display apparatus according to an embodiment of the present invention.
Figure 3:
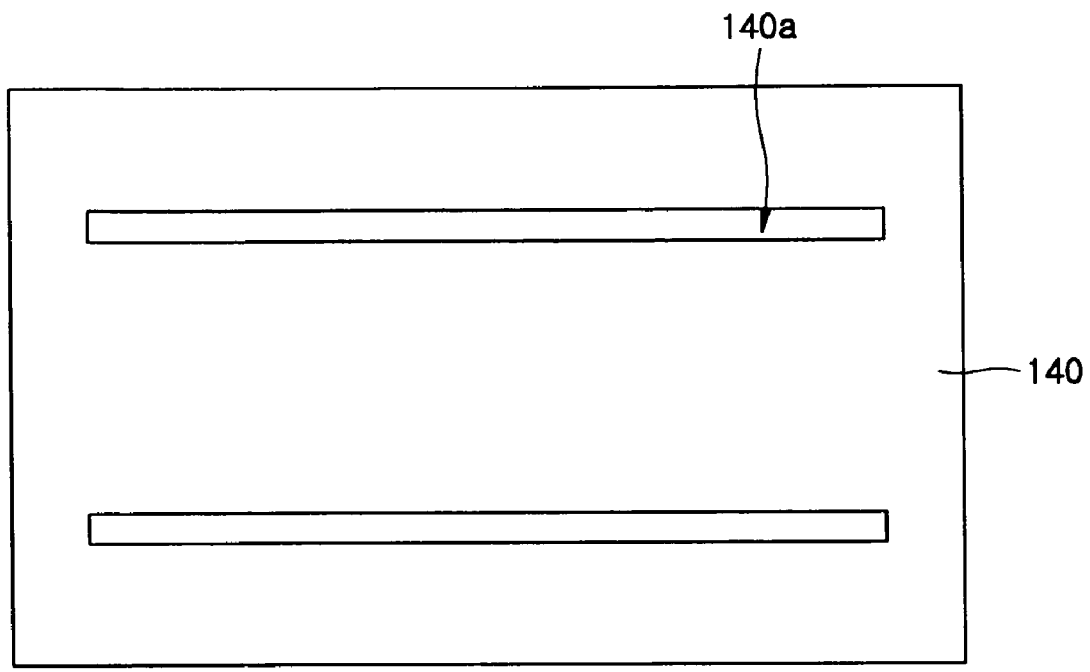
FIG. 3 is a top plan view of a first embodiment of the thermal conductive sheet of FIG. 2.

FIG. 2 is an exploded perspective view of a plasma display apparatus according to an embodiment of the present invention, while FIG. 3 is a top plan view of a first embodiment of the thermal conductive sheet of FIG. 2.

As shown in FIG. 2, the plasma display apparatus 100 comprises: a plasma display panel 110; a chassis base 120 having a front part on which the plasma display panel 110 is installed, and having a back part on which circuit boards 130 including circuits 135 for driving the plasma display panel 110 are installed; and a single thermal conductive sheet 140 arranged between the plasma display panel 110 and the chassis base 120.

The plasma display panel 110, which displays an image, comprises a first panel 111 and a second panel 112. Although not shown in FIGS. 2 and 3, the first panel 111 comprises a front substrate, discharge sustain electrode pairs formed on a lower surface of the front substrate, a first dielectric layer covering the discharge sustain electrode pairs, and protective layers formed on the first dielectric layers. The second panel 112 comprises a back substrate, address electrodes intersecting the discharge sustain electrode pairs on an upper surface of the back substrate, a second dielectric layer covering the address electrodes, partition walls formed on the second dielectric layer, and fluorescent layers coated inside discharge cells defined by the partition walls. Such plasma display panel 110 has a three-electrode surface-discharge structure, but the present invention is not limited to that structure, and an image can be embodied with various other structures, such as a two-electrode opposite-discharge structure. Because the structure and drive method of the plasma display panel 110 are obvious to those of ordinary skill in the art, they will not be described in detail.

The chassis base 120 is capable of being made by cast, press processing, etc., and supports the plasma display panel 110 and the circuit boards 130. It is preferable that the chassis base 120 be made of metal, such as aluminum, having a high thermal conductivity in order to effectively transfer heat from the plasma display panel 110 to the outside.

A thermal conductive sheet 140 having high thermal conductivity is interposed between the plasma display panel 110 and the chassis base 120.

In the present invention, because the thermal conductive sheet 140 is made of a single sheet, the manufacturing time is decreased. The thermal conductive sheet 140 transfers heat generated in the plasma display panel 110 to the chassis base 120. Furthermore, because heat is greatly generated at local portions of the plasma display panel 110, mis-discharge can occur due to high temperature. However, because heat is diffused to the surroundings by thermal conductive sheet 140, a high temperature phenomenon at local portions is decreased. Silicone sheet, acryl sheet, urethane sheet, graphite sheet, etc. can be used as thermal conductive sheet 140.

As shown in FIGS. 2 and 3, cut away portions 140a are formed on the inside of the thermal conductive sheet 140. The cut away portions 140a have the shape of a slit which extends to a predetermined length. In the present embodiment, the cut away portions 140a extend in the horizontal direction relative to thermal conductive sheet 140, but the present invention is not limited to the above-mentioned shape or to a specific number of cut away portions.

Figure 4:
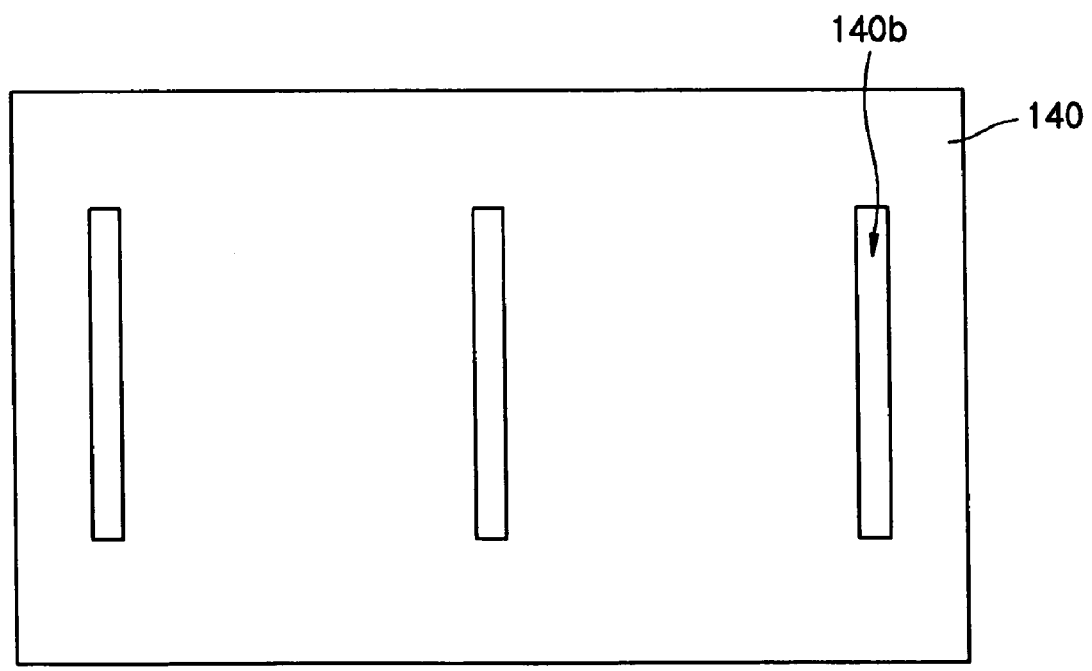
FIG. 4 is a top plan view of a second embodiment of the thermal conductive sheet of FIG. 2, in which cut away portions having a slit shape are arranged in a vertical direction.
Figure 5:
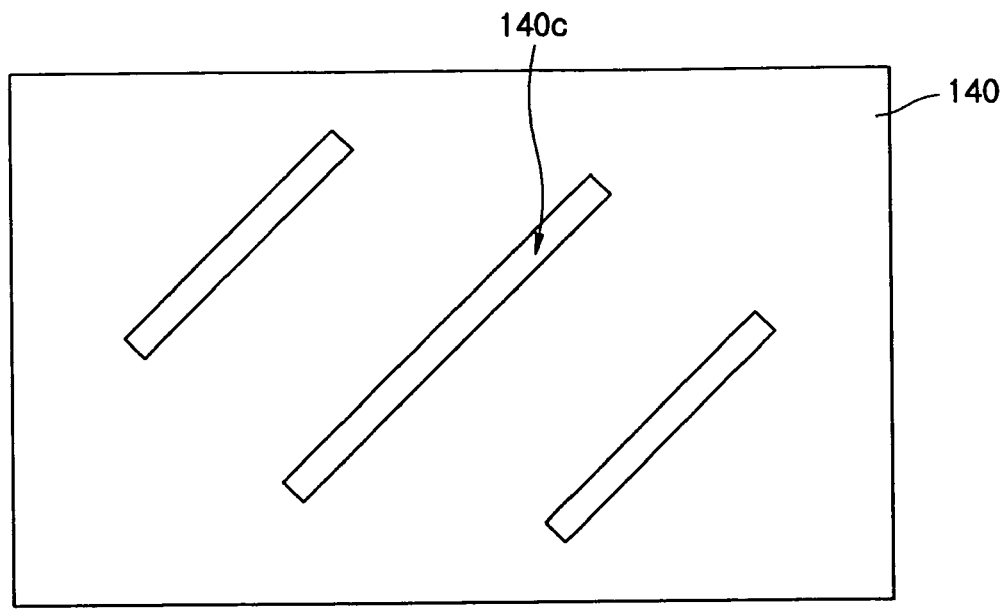
FIG. 5 is a top plan view of a third embodiment of the thermal conductive sheet of FIG. 2, in which cut away portions having a slit shape are arranged in the oblique direction.

FIG. 4 is a top plan view of a second embodiment of the thermal conductive sheet of FIG. 2, in which cut away portions having a slit shape are arranged in a vertical direction; FIG. 5 is a top plan view of a third embodiment of the thermal conductive sheet of FIG. 2, in which cut away portions having a slit shape are arranged in the oblique direction; and FIG. 6 is a top plan view of a fourth embodiment of the thermal conductive sheet of FIG. 2, in which cut away portions having a hole shape are provided.

Figure 6:
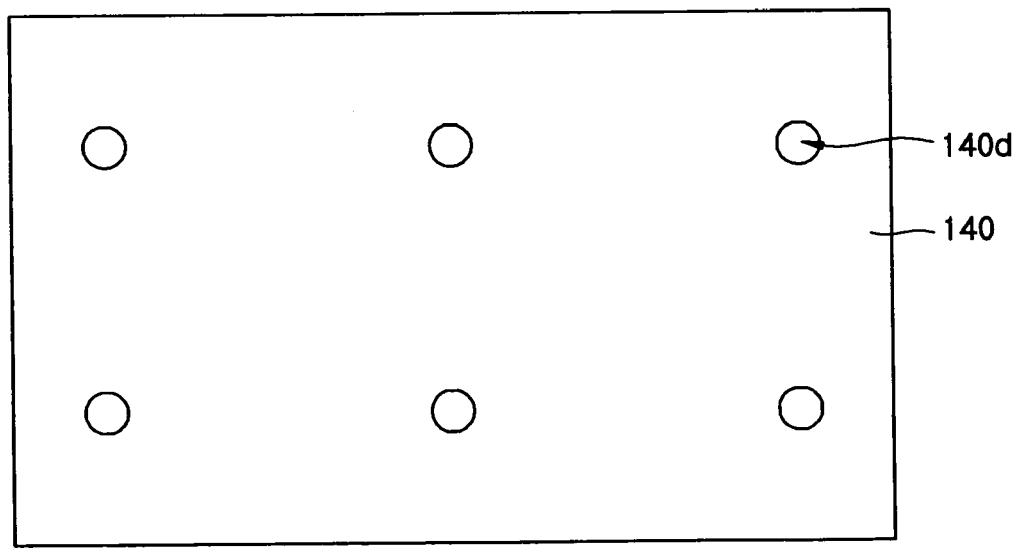
FIG. 6 is a top plan view of a fourth embodiment of the thermal conductive sheet of FIG. 2, in which cut away portions having a hole shape are provided.

As shown in FIGS. 4 through 6, the cut away portions 140b have the shape of a slit extending in the vertical direction, the cut away portions 140c have the shape of a slit extending in the oblique direction, and the cut away portions 140d have the shape of a ball. The number of cut away portions can vary.

Returning to FIG. 2, shock-absorbing elements 160 are arranged inside the cut away portions 140a. The shock-absorbing elements 160 perform the function of absorbing shock (vibration) or noise occurring at the plasma display panel 110 or at the circuit boards 130. Double sided adhesive tape, foam silicone sheet, damping sheet including damping filler, etc. can be used as shock-absorbing elements 160. It is preferable to use materials having an elasticity better than thermal conductive sheet 140. Designers can select the shape or the number of the cut away portions 140a or materials for shock-absorbing elements 160 depending on the quantity of heat generated in the plasma display panel 110, the required noise level, the shock level, etc. The noise level of the plasma display apparatus 100 according to the present invention is decreased to about $27^{dB}$ or less, down from the noise level ($30^{dB}$) of a conventional apparatus.

It is preferable that such plasma display panel 110 and the chassis base 120 be fixed to each other using double sided adhesive tapes 150. In the present invention, the double sided adhesive tapes 150 are arranged so that they surround the thermal conductive sheet 140.

The size of chassis base 120 increases with that of the plasma display panel 110. However, when the size of the chassis base 120 increases, the possibility of buckling in the chassis base 120 increases due to an external load, whereby its structural stability deteriorates. Furthermore, because the temperature of the chassis base 120 rises when driving the plasma display panel 110, the chassis base 120 may be bent forward or backward due to thermal expansion. If the chassis base 120 is bent, it does not stably support the plasma display panel 110, and becomes separated from the plasma display panel 110. Therefore, heat generated in the plasma display panel 110 is not effectively transferred to the chassis base 120. In order to solve these problems, a plurality of reinforcement members (not shown) are arranged on the back of the chassis base 120. The reinforcement members have a transverse cross-section of various shapes, and preferably have a length that extends in one direction.

Circuit boards 130 for driving the plasma display panel 110 are arranged on the back of the chassis base 120. Circuits 135 for driving the plasma display panel 110 are mounted in these circuit boards 130. In this regard, circuits 135 include various types of circuits such as circuits for supplying power to provide a display on the plasma display panel 110 and circuits for transmitting signals to form an image on the plasma display panel 110. The circuit boards 130 are electrically connected to the plasma display panel 110 by a connection cable 137, such as a tape carrier package.

When employing the plasma display apparatus according to the present invention, manufacturing time for the plasma display apparatus is shortened.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A plasma display apparatus, comprising:
a plasma display panel;
a chassis base having a front part on which the plasma display panel is installed, and having a back part on which circuit boards including circuits for driving the plasma display panel are installed;
at least one thermal conductive sheet positioned between the plasma display panel and the chassis base, and having a cut away portion formed on an interior thereof; and
a separate shock-absorbing element disposed within the cut away portion.

2. The plasma display apparatus according to claim 1, wherein said at least one thermal conductive sheet comprises a single sheet.

3. The plasma display apparatus according to claim 1, wherein the cut away portion is shaped as a slit extending to a predetermined length.

4. The plasma display apparatus according to claim 3, wherein the cut away portion extends in a horizontal direction relative to said at least one thermal conductive sheet.

5. The plasma display apparatus according to claim 3, wherein the cut away portion extends in a vertical direction relative to said at least one thermal conductive sheet.

6. The plasma display apparatus according to claim 3, wherein the cut away portion extends in an oblique direction relative to said at least one thermal conductive sheet.

7. The plasma display apparatus according to claim 1, wherein the cut away portion is shaped as a hole.

8. The plasma display apparatus according to claim 1, wherein the shock-absorbing element comprises a double sided adhesive tape.

9. The plasma display apparatus according to claim 1, wherein the shock-absorbing element comprises a foam silicone sheet.

10. The plasma display apparatus according to claim 1, wherein the shock-absorbing element comprises a damping sheet including a damping filler.

11. The plasma display apparatus according to claim 10, wherein the shock-absorbing element has elasticity greater than said at least one thermal conductive sheet.

12. The plasma display apparatus according to claim 10, further comprising a double adhesive tape positioned on a circumference of said at least one thermal conductive sheet for attaching the plasma display panel to the chassis base.

13. A plasma display apparatus, comprising:
a plasma display panel;
a chassis base having a front part on which the plasma display panel is installed, and having a back part on which circuit boards including circuits for driving the plasma display panel are installed;
at least one thermal conductive sheet positioned between the plasma display panel and the chassis base, and having a cut away portion formed on an interior thereof; and
a shock-absorbing element disposed within the cut away portion;
wherein the shock-absorbing element has elasticity greater than said at least one thermal conductive sheet.

14. The plasma display apparatus according to claim 13, further comprising a double adhesive tape positioned on a circumference of said at least one thermal conductive sheet for attaching the plasma display panel to the chassis base.

15. A plasma display apparatus, comprising:
a plasma display panel;
a chassis base having a front part on which the plasma display panel is installed, and having a back part on which circuit boards including circuits for driving the plasma display panel are installed;
at least one thermal conductive sheet positioned between the plasma display panel and the chassis base, and having a cut away portion formed on an interior thereof;
a shock-absorbing element disposed within the cut away portion; and
a double adhesive tape positioned on a circumference of said at least one thermal conductive sheet for attaching the plasma display panel to the chassis base.

16. A plasma display apparatus, comprising:
a plasma display panel;
a chassis base having a front part on which the plasma display panel is installed, and having a back part on which circuit boards including circuits for driving the plasma display panel are installed;
at least one thermal conductive sheet positioned between the plasma display panel and the chassis base, and having a cut away portion formed on an interior thereof; and
a shock-absorbing element disposed within the cut away portion;
wherein the cut away portion extends in an oblique direction relative to said at least one thermal conductive sheet.

17. The plasma display apparatus according to claim 16, wherein the shock-absorbing element has elasticity greater than said at least one thermal conductive sheet.

18. The plasma display apparatus according to claim 16, further comprising a double adhesive tape positioned on a circumference of said at least one thermal conductive sheet for attaching the plasma display panel to the chassis base.

* * * * *